United States Patent [19]

Bharat et al.

[11] Patent Number: 4,896,202

[45] Date of Patent: Jan. 23, 1990

[54] SHORT WAVELENGTH IMPURITY BAND CONDUCTION DETECTORS

[75] Inventors: Ramasesha Bharat, Orange; Michael D. Petroff, Fullerton, both of Calif.

[73] Assignee: Rockwell International Corporation, El Segundo, Calif.

[21] Appl. No.: 209,244

[22] Filed: Jun. 20, 1988

[51] Int. Cl.$^4$ .......................... N01L 29/12; G01J 1/00; G01T 1/22

[52] U.S. Cl. ......................................... 357/30; 357/58; 250/338.4; 250/349; 250/370.01

[58] Field of Search ...................... 357/30 R, 58, 30 L; 250/338.4, 370.01, 349, 58

[56] References Cited

U.S. PATENT DOCUMENTS

| | | | |
|---|---|---|---|
| 3,904,879 | 9/1975 | Amingual et al. | 250/338 |
| 4,244,088 | 12/1980 | Myers | 357/19 |
| 4,568,960 | 2/1986 | Petroff et al. | 357/30 |
| 4,586,068 | 4/1986 | Petroff et al. | 357/30 |

Primary Examiner—Martin H. Edlow
Assistant Examiner—Stephen D. Meier
Attorney, Agent, or Firm—H. Fredrick Hamann; John J. Deinken

[57] ABSTRACT

An edge illuminated impurity band conduction detector includes an extrinsic semiconducting IR-active layer with a first conductivity type impurity concentration high enough to create an impurity energy band. An intrinsic semiconducting blocking layer includes first and second conductivity type impurity concentration low enough that substantially no charge transport occurs by an impurity conduction mechanism. The IR-active and blocking layers are positioned between first and second contacts such that an electrical potential applied to the contacts creates an electric field across the layers. The detector is oriented such that the electromagnetic energy impinges on an edge of the IR-active layer and propagates in the IR-active layer in a direction substantially orthogonal to the applied electric field, the IR-active layer extending in the orthogonal direction for at least the absorption length of the electromagnetic energy. The detector may further include an extrinsic semiconducting buffered layer positioned with the IR-active layer between the blocking layer and the buffered layer, the buffered layer having a first conductivity type impurity concentration high enough to create an impurity energy band and a second conductivity type impurity concentration high enough that first conductivity type carriers injected into the buffered layer recombine with ionized first conductivity type impurities. In this embodiment, the IR-active layer further includes a second conductivity type impurity concentration low enough that first conductivity type carriers photogenerated in the IR-active layer can drift through the IR-active layer without recombining with ionized first conductivity type impurities.

19 Claims, 1 Drawing Sheet

SHORT WAVELENGTH IMPURITY BAND CONDUCTION DETECTORS

BACKGROUND OF THE INVENTION

This invention is concerned with the detection of electromagnetic radiation. In particular, a wide variety of scientific, medical, industrial, and military applications require the detection of infrared (IR) radiation. The field of IR photoconductive detectors was significantly advanced with the development of impurity band conduction (IBC) devices. These devices, including the Blocked Impurity Band (BIB) detector (described in Petroff, et al., U.S. Pat. No. 4,568,960) and the Solid State Photomultiplier (SSPM) (described in Petroff, et al., U.S. Pat. No. 4,586,068), exhibit improved performance compared to earlier photoconductive detectors. IBC detectors have been fabricated in silicon using either arsenic or gallium dopant atoms with concentrations approximately an order of magnitude greater than had been practical with prior photoconductive detector designs. These high concentrations of majority dopant atoms enable the construction of a thin detector with high quantum efficiency, reduced sensitivity to nuclear radiation, and none of the irregular electrical characteristics found in the photoconductors of the prior art. The SSPM, whose design builds upon the improvements achieved by the BIB detector, is capable of continuously detecting single photons.

IBC devices were originally developed primarily for applications requiring long wavelength infrared (LWIR—approximately 5 to 30 micrometers) photon detection. It would be desirable, however, to extend the quantum efficiency of these impurity band conduction devices to shorter wavelengths for which the absorption length is significantly greater that the thickness of the active layer of the device.

SUMMARY OF THE INVENTION

This invention enables the benefits of impurity band conduction devices to be extended to the detection of electromagnetic energy at shorter wavelengths.

An edge illuminated impurity band conduction detector constructed according to this invention includes an extrinsic semiconducting IR-active layer with a first conductivity type impurity concentration which is high enough to create an impurity energy band. An intrinsic semiconducting blocking layer includes first and second conductivity type impurity concentrations which are low enough that substantially no charge transport occurs by an impurity conduction mechanism. The IR-active and blocking layers are positioned between first and second contacts such that an electrical potential applied to the contacts creates an electric field across the layers. The detector is oriented such that the electromagnetic energy impinges on an edge of the IR-active layer and propagates in the IR-active layer in a direction substantially orthogonal to the applied electric field, the IR-active layer extending in the orthogonal direction for at least the absorption length of the electromagnetic energy.

The first conductivity type impurities may be donor impurities and the second conductivity type impurities acceptor impurities, or the first conductivity type impurities may be acceptor impurities and the second conductivity type impurities donor impurities.

The blocking layer may be an undoped semiconducting layer.

The detector may also include a substrate, with the IR-active layer epitaxially deposited on the substrate and the blocking layer epitaxially deposited on the IR-active layer. The first contact may be a degenerately doped region in the blocking layer, an ion implanted region in the blocking layer, or a contact layer epitaxially deposited on the blocking layer.

In a more particular embodiment, the detector further includes an extrinsic semiconducting buffered layer positioned such that the IR-active layer is between the blocking layer and the buffered layer, the buffered layer having a first conductivity type impurity concentration which is high enough to create an impurity energy band and a second conductivity type impurity concentration which is high enough that first conductivity type carriers injected into the buffered layer recombine with ionized first conductIvity type impurities. In this embodiment, the IR-active layer further includes a second conductivity type impurity concentration which is low enough that first conductivity type carriers photogenerated in the IR-active layer can drift through the IR-active layer without recombining with ionized first conductivity type impurities.

DESCRIPTION OF THE INVENTION

It is an outstanding feature of this invention to provide edge-illuminated IBC (impurity band conduction) detectors which exhibit substantially increased quantum efficiency in sensing incoming light whose absorption length is greater than the thickness of the IR-active (infrared-active) layers of the detectors. The advantages of this invention may be achieved with both BIB (Blocked Impurity Band) detectors and SSPMs (Solid State Photomultipliers), which are discussed in more detail in U.S. Pat. Nos. 4,568,960 (BIB detectors) and 4,586,068 (SSPMs).

Figure 1:
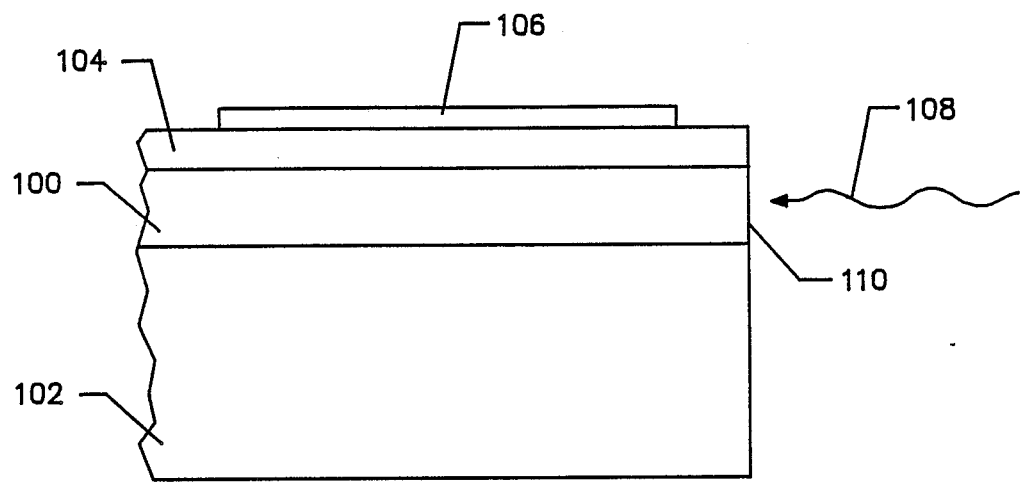
FIG. 1 is a cross-sectional side view illustrating the structure of an edge illuminated BIB detector constructed according to this invention.

FIG. 1 is a cross-sectional side view illustrating the structure of an edge illuminated BIB detector constructed according to this invention. As those skilled in the art will appreciate, some of the spatial dimensions of the drawings are exaggerated relative to other dimensions in order to better explain the operation and features of the invention. An extrinsic semiconducting IR-active layer 100 is deposited on a degenerately doped substrate 102 and is doped with a first conductivity type impurity (donor) concentration which is high enough to create an impurity energy band in the IR-active layer. An intrinsic semiconducting blocking layer 104 is deposited on the IR-active layer and is provided with first and second conductivity type impurity (donor and acceptor) concentrations which are low enough that substantially no charge transport will occur in the blocking layer by an impurity conduction mechanism, i.e., significant charge transport can occur in the blocking layer only by means of electrons in the conduction band or holes in the valence band. A metallized ohmic contact 106 is formed on the blocking layer. An electrical potential applied between the contact 106 and the degenerate substrate 102 will create an electric field across the IR-active and blocking layers.

When this BIB detector is exposed to incoming optical energy 108, each photon absorbed by a neutral donor in the IR-active layer 100 produces an ionized donor and a conduction band electron. The electric field applied across the device sweeps these electrons through the blocking layer 104, after which they are collected by the contact 106. The ionized charges proceed through the device in the opposite direction by hopping conduction and are neutralized in the substrate 102.

In an outstanding feature of the present invention, the detector is oriented so that the incoming electromagnetic energy 108 enters the IR-active layer 100 through a polished or cleaved edge 110 of the IR-active layer and thus propagates through the IR-active layer in a direction substantially orthogonal to the applied electric field. This configuration is referred to as edge illumination. By ensuring that the IR-active layer extends in this orthogonal direction for at least the absorption length (the inverse of the absorption coefficient) of the optical energy being detected, the quantum efficiency of the detector is greatly increased. This improvement in quantum efficiency occurs when the absorption length of the light being detected is much greater than the layer thickness of the IR-active layer, which typically occurs in the wavelength region between 0.95 and 5 $\mu$m.

Figure 2:
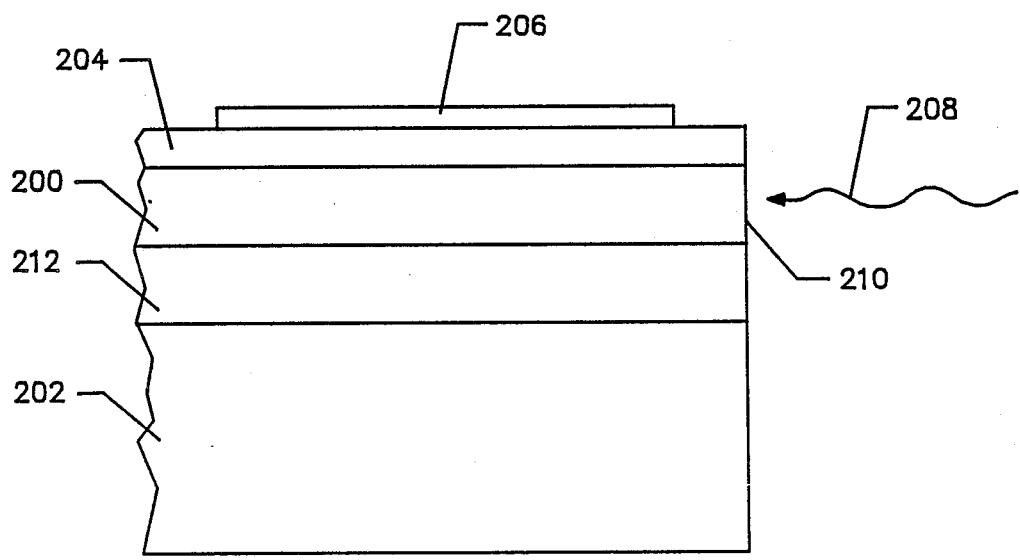
FIG. 2 is a cross-sectional side view illustrating an edge illuminated SSPM constructed according to this invention.

FIG. 2 is a cross-sectional side view which is similar to that of FIG. 1 but illustrates an edge illuminated SSPM constructed according to this invention. In this embodiment the substrate 202, the IR-active layer 200, the blocking layer 204, and the contact 206 are similar to the analogous elements of the edge illuminated BIB detector shown in FIG. 1. In addition, however, an extrinsic semiconducting buffered layer 212 is positioned such that the IR-active layer is between the blocking layer and the buffered layer. The buffered layer has a first conductivity type impurity concentration which is high enough to create an impurity energy band and a second conductivity type impurity concentration which is high enough that first conductivity type carriers injected into the buffered layer recombine with ionized first conductivity type impurities. In this SSPM embodiment the IR-active layer also includes a second conductivity type impurity concentration which is low enough that first conductivity type carriers photogenerated in the IR-active layer can drift through the IR-active layer without recombining with ionized first conductivity type impurities.

In the SSPM embodiment of FIG. 2, when the electrical contact 206 is positioned to collect electrons from the blocking layer without injecting holes and the degenerate substrate 202 collects ionized donor charges from the impurity band in the IR-active layer, a proper electrical bias applied across the detector will enable it to detect individual photons.

An illustrative thickness for the IR-active layer in an arsenic-doped silicon (Si:As) IBC detector is 25 $\mu$m, with a 50 $\mu$m thickness projected for future detectors. Thicknesses in this range are amenable to edge illuminated detector widths in the orthogonal direction which can exceed 500 $\mu$m, depending on the focal length to diameter ratio of the optical system which is used and the degree of grazing angle reflection that is expected at the interface between the IR-active layer and the substrate contact. In Si:As devices, the longest absorption length is about 600 $\mu$m at a wavelength of about 1.1 $\mu$m. At this wavelength, the quantum efficiency of an edge illuminated BIB or SSPM detector which is 800 $\mu$m wide is calculated to be 50% in the absence of antireflective coatings. This 50% value should be compared to the efficiency of conventional front and back illuminated detector configurations. At the 1.1 $\mu$m wavelength, a back illuminated device with a reflecting front contact would have a quantum efficiency of only 8% for the projected 50 $\mu$m infrared layer thickness, while the quantum efficiency of a front illuminated device would be even lower at about 5%. The optical system used with a detector can also have an effect on the efficiency of the system. A 500 $\mu$m long edge illuminated detector can be used with an f/2 optical system, even if no appreciable grazing angle reflection takes place. A longer detector can be used, with either a slower optical system or a contact of sufficiently high carrier concentration, to obtain quantum efficiencies approaching 100% when antireflective coatings are used. A 2.5 mm long edge illuminated SSPM, for example, designed for a 1.06 $\mu$m wavelength f/2 optical system, will have a quantum efficiency of 99%, assuming that a perfect antireflecting coating is deposited over the polished edge of the IR-active layer and that the contact doping concentration is greater than $10^{19}$cm$^{-3}$.

As those skilled in the art will appreciate, the edge illuminated detectors of this invention require cryogenic support systems, output electronics, and signal processing circuitry to operate as detection systems. Since the design of such output and signal processing circuitry is well known to those skilled in the art, however, there is no need to describe it here in any detail.

The preferred embodiments of this invention have been illustrated and described above. Modifications and additional embodiments, however, will undoubtedly be apparent to those skilled in the art. This technique, for example, is also useful to provide improved quantum efficiency for detection in other regions of the electromagnetic spectrum where longer optical paths are desired. The first conductivity type impurities may be donor impurities and the second conductivity impurities may be acceptor impurities, or vice versa. The various layers of these devices may be epitaxially deposited, while the contacts may be degenerately doped regions or ion implanted regions. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

The teaching of U.S. Pat. Nos. 4,568,960 (BIB detectors) and 4,586,068 (SSPMs), which provide additional details regarding the operating mechanisms of IBC devices and various structural configurations for the devices, are incorporated by reference.

We claim:

1. An edge illuminated impurity band conduction detector for operation under an applied electric field to detect short wavelength infrared electromagnetic energy, comprising:

an extrinsic semiconducting IR-active layer having a thickness less than the absorption length of the electromagnetic energy and with a first conductivity type impurity concentration which is high enough to create an impurity energy band;

an intrinsic semiconducting blocking layer with first and second conductivity type impurity concentrations which are low enough that substantially no charge transport occurs by an impurity conduction mechanism; and first and second electrical contacts, the IR-active and blocking layers being positioned between the contacts such that an electrical potential applied to the contacts creates an electric field across the layers, with the detector oriented such that the electromagnetic energy impinges on an edge of the IR-active layer and propagates in the IR-active layer in a direction substantially orthogonal to the applied electric field, the IR-active layer extending in the orthogonal direction for at least the absorption length of the electromagnetic energy.

2. The detector of claim 1, wherein the first conductivity type impurities further comprise donor impurities and the second conductivity type impurities further comprise acceptor impurities.

3. The detector of claim 1, wherein the first conductivity type impurities further comprise acceptor impurities and the second conductivity type impurities further comprise donor impurities.

4. The detector of claim 1, wherein the blocking layer further comprises an undoped semiconducting layer.

5. The detector of claim 1, further comprising a substrate and wherein the IR-active layer further comprises an IR-active layer epitaxially deposited on the substrate.

6. The detector of claim 5, wherein the blocking layer further comprises a blocking layer epitaxially deposited on the IR-active layer.

7. The detector of claim 6, wherein the first contact further comprises a degenerately doped region in the blocking layer.

8. The detector of claim 6, wherein the first contact further comprises an ion implanted region in the blocking layer.

9. The detector of claim 6, wherein the first contact further comprises a contact layer epitaxially deposited on the blocking layer.

10. The detector of claim 1, further comprising an extrinsic semiconductor buffered layer positioned such that the IR-active layer is between the blocking layer and the buffered layer, the buffered layer having a first conductivity type impurity concentration which is high enough to create an impurity energy band and a second conductivity type impurity concentration which is high enough that first conductivity type carriers injected into the buffered layer recombine with ionized first conductivity type impurities, the IR-active layer further comprising a second conductivity type impurity concentration which is low enough that first conductivity type carriers photogenerated in the IR-active layer can drift through the IR-active layer without recombining with ionized first conductivity type impurities.

11. An edge illuminated impurity band conduction detector for operation under an applied electric field to detect short wavelength infrared electromagnetic energy, comprising:

an intrinsic semiconducting blocking layer with first and second conductivity type impurity concentrations which are low enough that substantially no charge transport occurs by an impurity conduction mechanism;

an extrinsic semiconducting buffered layer with a first conductivity type impurity concentration which is high enough to create an impurity energy band and with a second conductivity type impurity concentration which is high enough that first conductivity type carriers injected into the buffered layer recombine with ionized first conductivity type impurities;

an extrinsic semiconducting IR-active layer between the blocking layer and the buffered layer having a thickness less than the absorption length of the electromagnetic energy and with a first conductivity type impurity concentration which is high enough to create an impurity energy band and with a second conductivity type impurity concentration which is low enough that first conductivity type carriers photogenerated in the IR-active layer can drift through the IR-active layer without recombining with ionized first conductivity type impurities;

a first electrical contact in contact with the blocking layer for collecting first conductivity type carriers without injecting second conductivity type carriers; and a second electrical contact in contact with the IR-active layer for collecting carriers from the impurity band, the blocking, buffered, and IR-active layers being positioned between the contacts such that an electrical potential applied to the contacts creates an electric field across the layers, with the detector oriented such that the electromagnetic energy impinges on an edge of the IR-active layer and propagates in the IR-active layer in a direction substantially orthogonal to the applied electric field, the IR-active layer extending in the orthogonal direction for at least the absorption length of the electromagnetic energy.

12. The detector of claim 11, wherein the first conductivity type impurities further comprise donor impurities and the second conductivity type impurities further comprise acceptor impurities.

13. The detector of claim 11, wherein the first conductivity type impurities further comprise acceptor impurities and the second conductivity type impurities further comprise donor impurities.

14. The detector of claim 11, wherein the blocking layer further comprises an undoped semiconducting layer.

15. The detector of claim 11, further comprising a substrate and wherein the buffered layer further comprises a buffered layer epitaxially deposited on the substrate and the IR-active layer further comprises an IR-active layer epitaxially deposited on the buffered layer.

16. The detector of claim 15, wherein the blocking layer further comprises a blocking layer epitaxially deposited on the IR-active layer.

17. The detector of claim 16, wherein the first contact further comprises a degenerately doped region in the blocking layer.

18. The detector of claim 16, wherein the first contact further comprises an ion implanted region in the blocking layer.

19. The detector of claim 16, wherein the first contact further comprises a contact layer epitaxially deposited on the blocking layer.

* * * * *